US005585655A

United States Patent [19]
Ota et al.

[11] Patent Number: 5,585,655
[45] Date of Patent: Dec. 17, 1996

[54] FIELD-EFFECT TRANSISTOR AND METHOD OF MANUFACTURING THE SAME

[75] Inventors: Yorito Ota, Hyogo; Katsunori Nishii, Osaka; Mitsuru Nishitsuji, Osaka; Hiroyuki Masato, Osaka; Hiromasa Fujimoto, Osaka, all of Japan

[73] Assignee: Matsushita Electric Industrial Co., Ltd., Osaka, Japan

[21] Appl. No.: 517,435

[22] Filed: Aug. 21, 1995

[30] Foreign Application Priority Data

Aug. 22, 1994 [JP] Japan .................................. 6-196393

[51] Int. Cl.⁶ ............................................. H01L 29/80
[52] U.S. Cl. .......................... 257/282; 257/283; 257/284; 257/194
[58] Field of Search .................................. 257/282, 283, 257/284, 623, 194, 627, 615, 768

[56] References Cited

U.S. PATENT DOCUMENTS 3,855,690 12/1974 Kim et al. .................................. 257/284
4,004,341 1/1977 Tung ........................................ 257/284
4,325,181 4/1982 Yoder ...................................... 257/284

FOREIGN PATENT DOCUMENTS 2-156544 6/1990 Japan .
2-180032 7/1990 Japan .

*Primary Examiner*—Mark V. Prenty
*Attorney, Agent, or Firm*—McDermott Will & Emery

[57] ABSTRACT

On a semi-insulating substrate is formed a conductive layer and an undoped layer. On specified regions of the conductive layer are formed ohmic electrodes, each serving as a source electrode or a drain electrode, via a pair of square contact regions. The circumferential edges of the contact regions are undercut beneath the ohmic electrodes. Between the pair of contact regions on the conductive layer is formed a gate electrode by self alignment using the ohmic electrodes as a mask. The gate electrode has extended in the direction of gate width and the extended portion serves as a withdrawn portion of the gate electrode. Upper electrodes are formed by self alignment in the same process in which the gate electrode is formed.

5 Claims, 11 Drawing Sheets

DIRECTION OF GATE LENGTH

F I G.1(a)
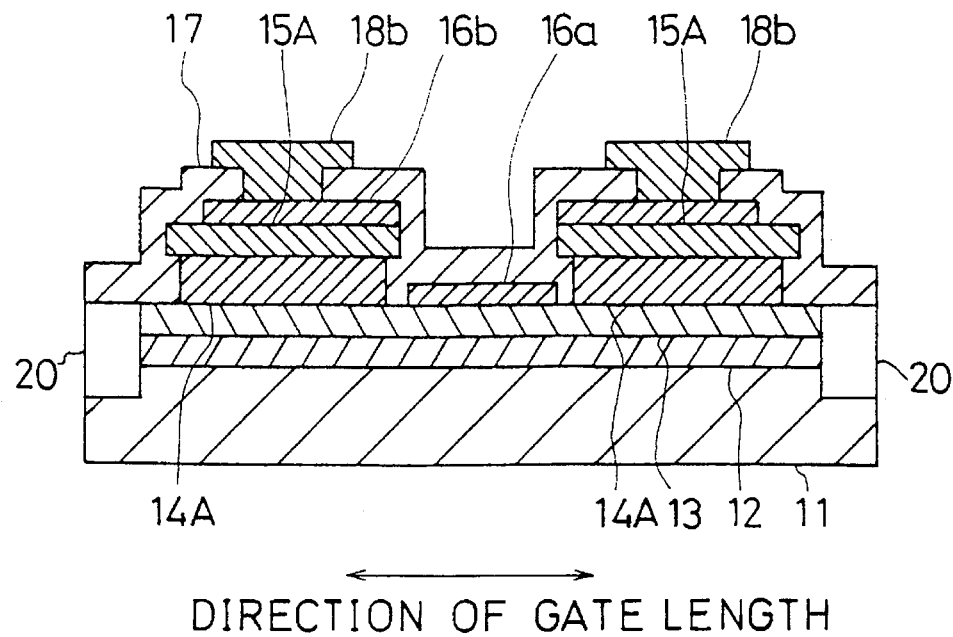
DIRECTION OF GATE LENGTH
F I G.1(b)
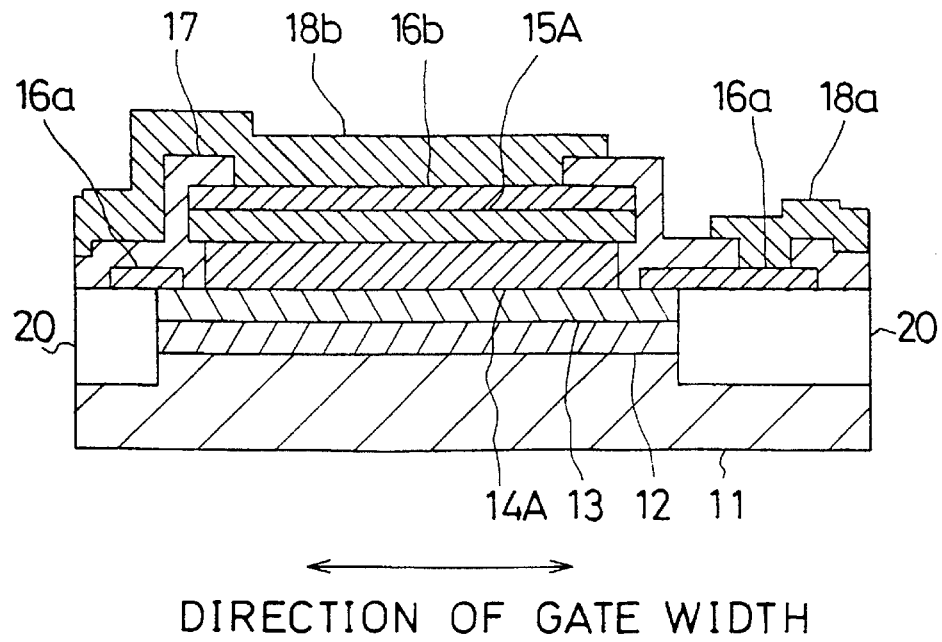
DIRECTION OF GATE WIDTH 5,585,655

FIELD-EFFECT TRANSISTOR AND METHOD OF MANUFACTURING THE SAME

BACKGROUND OF THE INVENTION

The present invention relates to a field-effect transistor and a manufacturing method thereof.

With the recent development of communication devices centering around portable telephones, field-effect transistors, particularly MESFETs each having a semi-insulating substrate composed of gallium arsenide (GaAs) (hereinafter referred to as GaAs MESFETs), have been in greater demand because of their high performance. Among these, such FETs as a GaAs MESFET using an epitaxial film and a MISFET (Metal Insulator Semiconductor FET) which exhibits an improved voltage resistance due to an undoped layer formed immediately below a gate electrode with no impurity mixed therein have found wide applications as microwave communication devices.

The latest technology trends in these MESFETs and MISFETs are to achieve low-power operation and to reduce power consumption. In increasing performance during low-power operation, in particular, an improvement in the rising of FETs, i.e., a reduction in ON resistance, is the most effective. Although a reduction in gate length is the most effective method of reducing the ON resistance, it is also a significant method to lower a parasitic resistance component by reducing the distance between a source electrode and a drain electrode.

Below, the structure of a conventional FET with such a structure will be described with reference to drawings.

FIG. 12 shows a cross-sectional structure in the direction of gate length of a conventional GaAs MESFET disclosed in Japanese Laid-Open Patent Publication No. 2-156544. In the drawing are shown: a semi-insulating substrate 1 composed of GaAs; a conductive layer 2 composed of n-type GaAs doped with Si as an impurity; contact regions 3 composed of $n^+$-type InGaAs highly doped with Si; ohmic electrodes 4 each serving as a drain electrode or a source electrode; a gate electrode 5 composed of a Schottky electrode; wiring layers 6 formed on the ohmic electrodes 4 simultaneously with the formation of the gate electrode 5; and sidewall barriers 7 composed of $SiO_2$, which have been formed to obtain a gate length shorter than the opening width of the ohmic electrodes 4.

Below, a description will be given to a method of manufacturing the GaAs MESFET with the above structure.

Initially, the conductive layer 2 is formed on the semi-insulating substrate 1 by epitaxial growth, followed by the formation of the contact layer serving as the contact regions 3 on the conductive layer 2 by epitaxial growth. Then, a first metal layer serving as the ohmic electrodes 4 is formed on the contact layer by sputtering or by vapor deposition, followed by etching with respect to the first metal layer to form an opening trench extending in the direction of gate width (in the direction perpendicular to the surface of the paper in FIG. 12), thereby forming the pair of ohmic electrodes 4 opposed to each other. Subsequently, wet etching is performed with respect to the above contact layer and conductive layer 2 using the pair of ohmic electrodes 4 as a mask, thereby forming an opening 8 having a cross section in the shape of an inverted mesa. Next, a $SiO_2$ film is formed over the entire surface by plasma CVD, followed by reactive ion etching performed with respect to the $SiO_2$ film, thereby forming the sidewall barriers 7. Next, a second metal layer is deposited by sputtering or vapor deposition, thereby forming the wiring layers 6. As a result, the metal film is deposited even inside the opening 8 using the ohmic electrodes 4 and sidewall barriers 7 as a mask, so that the gate electrode 5 having a length equal to the size of the trench between the barriers 7 is formed by self alignment.

With the above structure, however, although it is possible to form the wiring layers 6 connected to the ohmic electrodes 4, it is impossible to form a wiring layer or a contact region connected to the gate electrode 5, so that the gate electrode 5 cannot be withdrawn to the outside of the field-effect transistor. Hence, the fabrication of the field-effect transistor with the above structure is practically difficult.

In a power-type field-effect transistor or the like, on the other hand, source regions and drain regions are alternately disposed like a comb. In manufacturing such a comb-type field-effect transistor, therefore, the source regions and drain regions composing the above field-effect transistor should be formed separately, which incurs an increase in chip size.

Moreover, according to the above manufacturing method, the process of forming the sidewall barriers 7 composed of $SiO_2$ is complicated, so that it is practically difficult to form the above sidewall barriers 7. Furthermore, in forming the sidewall barriers 7 by performing reactive ion etching with respect to the $SiO_2$ film formed over the entire surface, the region of the conductive layer 2 in which the gate electrode 5 is to be formed is damaged and hence the channel region of the field-effect transistor is also damaged, so that the voltage resistance of the field-effect transistor is significantly lowered.

SUMMARY OF THE INVENTION

An object of the present invention is to solve all the above problems in one stroke such that a withdrawn portion of the gate electrode is formed by self alignment, that an increase in chip size is not incurred even when a comb-type field-effect transistor is formed, and that the voltage resistance thereof is not lowered.

To attain the above object, according to the present invention, each of the source electrode and drain electrode is formed into a square configuration, while the gate electrode and its withdrawn portion extending therefrom in the direction of gate width are formed by self alignment using, as a mask, at least the source electrode of the source electrode and drain electrode.

A field-effect transistor according to the present invention comprises: a semi-insulating substrate; a conductive layer formed on a specified region of the semi-insulating substrate; a pair of square contact regions formed on the conductive layer so as to be opposed to each other and having their circumferential edges undercut; a source electrode formed on one of the pair of contact regions so as to be in ohmic contact with the contact region; a drain electrode formed on the other of the pair of contact regions so as to be in ohmic contact with the other contact region; a gate electrode formed, over the conductive layer in a first region between the source electrode and the drain electrode and in a second region extending continuously from the first region in a direction of gate width to the outside of the above conductive layer, by self alignment using the source electrode as a mask, the above gate electrode being smaller in layer thickness than the contact regions and in Schottky contact with the conductive layer; and an upper electrode for the source electrode formed on the source electrode in the same process in which the gate electrode is formed so as to be in ohmic contact with the source electrode.

Since the gate electrode is formed by self alignment using the source electrode as a mask, no gap is observed in two dimensions between an end of the gate electrode and the corresponding end of the source electrode. Since the distance between an end of the gate electrode and the corresponding end of the source electrode is thus minimized, a parasitic resistance can be lowered significantly. In this case, undercut portions are formed along the circumferential edges of the rectangular contact regions and the layer thickness of the gate electrode is smaller than the layer thickness of the contact regions, so that no electrical connection is provided between the gate electrode and the contact regions.

In addition, since the source electrode and drain electrode are in ohmic contact with the entire surface of the contact region, the contact resistance in the source electrode and drain electrode can be suppressed, thereby significantly reducing the ON resistance on the rising of the field-effect transistor.

Moreover, since the gate electrode is formed in the first region between the source electrode and drain electrode and in the second region extending continuously from the first region in the direction of gate width toward the outside of the conductive layer, the second region can be used as a withdrawn portion of the gate electrode, so that the gate electrode is withdrawn to the outside of the field-effect transistor without fail.

Furthermore, with the power-type field-effect transistor, a plurality of pairs of square contact regions are juxtaposed such that gate electrodes are formed between the respective pairs of contact regions, thereby reducing chip size.

In the above field-effect transistor, the gate electrode is preferably formed by self alignment using the source electrode and the drain electrode as a mask. It is also preferred that the above field-effect transistor further comprises an upper electrode for the drain electrode formed on the drain electrode in the same process in which the gate electrode is formed so as to be in ohmic contact with the drain electrode.

With the arrangement, no gap is observed in two dimensions between an end of the gate electrode and the corresponding end of the source electrode or drain electrode. Since the distance between the ends of the gate electrode and the corresponding ends of the source electrode and of the drain electrode are thus minimized, a parasitic resistance can be lowered more significantly.

In the above field-effect transistor, an undoped layer is preferably provided between the conductive layer and the pair of contact regions. With the arrangement, the impurity concentration between the gate electrode and the conductive layer is lowered, so that the voltage resistance of the field-effect transistor is increased.

In the above field-effect transistor, the semi-insulating substrate is preferably composed of a GaAs substrate with a surface on a (100) plane orientation; each of the conductive layer and contact layers is preferably formed by crystal growth; and the direction of gate width is preferably set to a [001] orientation. With the arrangement, an undercut portion vertical in cross section is formed along the circumferential edges of each of the contact regions, so that electrical insulation is surely provided between the contact regions and the gate electrode.

In the above field-effect transistor, each of the pair of contact regions is preferably composed of InGaAs or InAs and each of the source electrode and drain electrode is preferably composed of a metal with a high melting point. With the arrangement, the contact property of the contact regions with respect to the source electrode and drain electrode is improved. As a result, even when the source electrode and drain electrode are brought into ohmic contact with the contact regions by non-heat treatment and then the contact regions are etched into square configurations by using the source electrode and drain electrode as a mask, the source electrode and the drain electrode seldom peel off the contact regions.

A manufacturing method of a field-effect transistor according to the present invention comprises: a first step of sequentially depositing a conductive layer and a contact layer on a semi-insulating substrate; a second step of depositing a first metal layer on the contact layer so as to provide ohmic contact therebetween; a third step of patterning the first metal layer so as to form a source electrode and a drain electrode opposed to each other; a fourth step of etching the contact layer by using the source electrode and drain electrode as a mask so as to form a pair of square contact regions having their circumferential edges undercut; a fifth step of forming, over the conductive layer, source electrode, and drain electrode, a resist pattern having openings corresponding to a first region between the source electrode and the drain electrode, to a second region extending continuously from the first region in a direction of gate width to the outside of the conductive layer, and to a third region consisting of that portion of the source electrode positioned closer to a gate electrode; and a sixth step of depositing, over the conductive layer and source electrode, a second metal film smaller in layer thickness than the contact layer by using the resist pattern as a mask so as to form, over the conductive layer in the first region and in the second region, the gate electrode in Schottky contact with the conductive layer and to form, on the source electrode in the third region, an upper electrode for the source electrode in ohmic contact with the source electrode.

Since the second metal film is deposited over the conductive layer, source electrode, and drain electrode by using the resist pattern with the openings corresponding to the first region, to the second region, and to the third region, the gate electrode is formed by self alignment over the first and second regions of the conductive layer, while the upper electrode for the source electrode is formed on the source electrode in the same process in which the gate electrode is formed. Consequently, the above field effect transistor can surely be formed at low cost in a reduced number of steps.

Moreover, since the gate electrode is formed by depositing the second metal film on the conductive layer, the conductive layer suffers no damage, so that the voltage resistance of the field-effect transistor does not deteriorate.

The third region of the resist pattern in the fifth step preferably consists of: that portion of the source electrode positioned closer to the gate electrode; and that portion of the drain electrode positioned closer to the gate electrode. The sixth step is preferably for depositing, over the conductive layer, source electrode, and drain electrode, a second metal film smaller in layer thickness than the contact layer by using the resist pattern as a mask so as to form, over the conductive layer in the first region and in the second region, the gate electrode in Schottky contact with the conductive layer and to respectively form, on the source electrode and drain electrode in the third region, the upper electrode for the source electrode in ohmic contact with the source electrode and an upper electrode for the drain electrode in ohmic contact with the drain electrode.

With the arrangement, the resist pattern also has the opening corresponding to that portion of the drain electrode positioned closer to the gate electrode, so that the upper electrode for the drain electrode can also be formed on the drain electrode in the same process in which the gate electrode is formed.

The first step is preferably for sequentially depositing the conductive layer, an undoped layer, and the contact layer on the semi-insulating substrate. With the arrangement, the undoped layer can be provided between the conductive layer and the contact layer, which ensures the manufacturing of a field-effect transistor with an improved voltage resistance.

The semi-insulating substrate in the first step is preferably composed of a GaAs substrate with a surface on a (100) plane orientation, each of the conductive layer and contact layer in the first step is preferably formed by crystal growth, and the direction of gate width in the fifth step is preferably set to a [001] orientation. With the arrangement, the undercut portions vertical in cross section can surely be formed along the circumferential edges of the respective contact regions, which ensures the manufacturing of a field-effect transistor in which electric insulation is surely provided between the contact regions and the gate electrode.

The contact layer in the first step is preferably composed of InGaAs or InAs and the first metal layer in the second step is preferably composed of a metal with a high melting point. With the arrangement, the contact property of the contact regions with respect to the source electrode and drain electrode is improved. As a result, even when etching is performed with respect to the contact layer using the source electrode and drain electrode as a mask in the fourth step, the source electrode and drain electrode seldom peel off the contact regions.

BRIEF DESCRIPTION OF THE DRAWINGS

FIGS. 1(a) and 1(b) show a field-effect transistor according to a first embodiment of the present invention, of which FIG. 1(a) is a cross section in the direction of gate length and FIG. 1(b) is a cross section in the direction of gate width;

FIGS. 2(a) and 2(b) to FIGS. 6(a) and 6(b) show the individual steps of a first manufacturing method of the field-effect transistor according to the first embodiment, of which FIGS. 2(a), 3(a), 4(a), 5(a), and 6(a) are cross sections in the direction of gate length and FIGS. 2(b), 3(b), 4(b), 5(b) and 6(b) are plan views;

FIGS. 10(a) and 10(b) show the individual steps of a second manufacturing method of the field-effect transistor according to the first embodiment, of which FIG. 10(a) is a cross section in the direction of gate length and FIG. 10(b) is a plan view;

DETAILED DESCRIPTION OF THE INVENTION

Figure 2A:
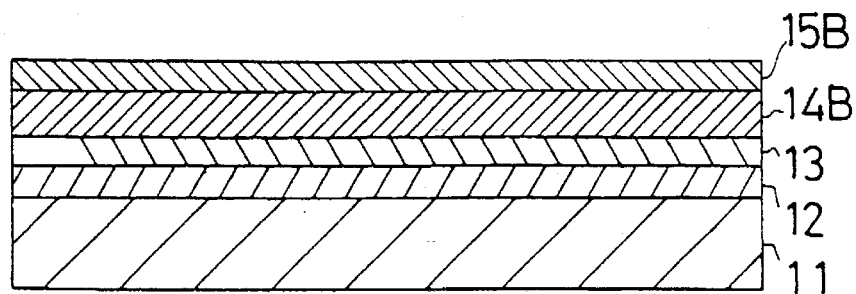

Below, the embodiments of the present invention will be described with reference to the drawings.

FIGS. 1(a) and 1(b) are cross sections of a GaAs MIST according to a first embodiment of the present invention, of which FIG. 1(a) shows a cross-sectional structure in the direction of gate length and FIG. 1(b) shows a cross-sectional structure in the direction of gate width, i.e., in the direction in which a gate electrode is withdrawn. FIG. 1(a) corresponds to a cross-sectional structure taken along the line A—A in FIG. 6(b), while FIG. 1(b) corresponds to a cross-sectional structure taken along the line B—B in FIG. 6(b).

In FIGS. 1(a) and 1(b) are shown: a semi-insulating substrate 11 composed of GaAs; a conductive layer 12 composed of n-type GaAs doped with Si as an impurity; and an undoped layer 13 composed of AlGaAs doped with no impurity. In general, the voltage resistance of a FET is determined by the distance between an end of a gate electrode and the corresponding end of a drain electrode or source electrode and by an impurity concentration immediately below the gate electrode. Therefore, the undoped layer 13 is provided on the conductive layer 12 in the first embodiment in order to lower the impurity concentration immediately below the gate electrode as a method of increasing the voltage resistance. The FET of the first embodiment can also be implemented without the provision of the undoped layer 13.

In FIGS. 1(a) and 1(b) are also shown: contact regions 14A formed from $n^+$-type InGaAs or $n^+$-type InAs in order to reduce a contact resistance; and ohmic electrodes 15A each serving as a source electrode or drain electrode in ohmic contact with the contact region 14A. Each of the ohmic electrodes 15A is composed of a metal with a high melting point such as WSi or WSiN. In the first embodiment, the contact regions 14A are in ohmic contact with the ohmic electrodes 15A by non-heat treatment (non-alloy). Since the ohmic electrodes 15A are not reactive with the semi-insulating substrate 11, if a normal metal is used for the non-alloy ohmic electrodes and the contact regions 14A are removed by wet etching using the non-alloy ohmic electrodes as a mask, the problem has arisen that the non-alloy ohmic electrodes easily peel off the contact regions 14A. However, if a metal with a high melting point is used as a material for composing the contact regions 14A as in the first embodiment, the peeling of the ohmic electrodes 15A does not occur, since the metal with a high melting point presents an excellent contact property with respect to the semi-insulating substrate 11.

In FIGS. 1(a) and 1(b) are also shown: a gate electrode 16a in Schottky contact with the undoped layer 13; and an upper electrode 16b in ohmic contact with the ohmic electrode 15A. Each of the gate electrode 16a and upper electrode 16b is composed of Al, Pt, Au, Al/Ti, Pt/Ti, Au/Ti, or Au/Pt/Ti. Among these, Al/Ti, Pt/Ti, Au/Ti, and Au/Pt/Ti have Ti thinly Formed below the metals of Al, Pt, and Au for the purpose of improving their contact properties. In this case, as shown in FIG. 1(b), the gate electrode 16a is formed to extend in the direction of gate width past the contact region 14A such that the extended portion is used as a withdrawn portion. As a result, electric connection can easily be provided between the gate electrode 16a and a wiring layer withdrawn to the outside from the FET region. The upper electrodes 16b are in ohmic contact with the ohmic electrodes 15A, thereby preventing an increase in electrode resistance resulting from a low electric conductivity, which is a drawback of the metal with a high melting point.

In FIGS. 1(a) and 1(b) are also shown: an interlayer insulating film 17 composed of a silicon nitride film or silicon dioxide film; a first wiring layer 18a connected to the gate electrode 16a so as to withdraw the gate electrode 16a to the outside; second wiring layers 18b connected to the upper electrodes 16b so as to withdraw the ohmic electrodes 15A to the outside; and an isolation region 20 into which hydrogen ions have been implanted to achieve isolation from other FETs.

As shown in FIG. 1(a), in the first embodiment, the gate electrode 16a is formed in the intermediate region between the ohmic electrodes 15A by self alignment using the ohmic electrodes 15A as a mask. Consequently, the gate electrode 16a is in a position extremely close to the source and drain electrodes in two dimensions, thus reducing the distance between the gate electrode 16a and the source or drain electrode. As a result, the ON resistance lower than that of a conventional FET is achieved.

As shown in FIG. 1(b), in the first embodiment, the gate electrode 16a is also formed by self alignment using the ohmic electrodes 15A as a mask in the direction of gate width, i.e., in the direction in which the gate is withdrawn. Consequently, the area occupied by the FET can be reduced.

As described above, in the field-effect transistor according to the first embodiment, island regions each consisting of the contact region 14A and the ohmic electrode 15A are formed on the undoped layer 13 formed on the semi-insulating substrate 11. As a result, the gate electrode 16a can be formed in a position extremely close to the ohmic electrodes 15A in each of the directions of gate length and gate width. Consequently, the distance between the gate electrode 16a and the source or drain electrode is reduced, which enables the lowering of the ON resistance and a reduction in area occupied by the FET.

Below, a first manufacturing method of the field-effect transistor according to the first embodiment will be described with reference to FIGS. 2(a) and 2(b) to FIGS. 6(a) and 6(b). Each of FIGS. 2(a), 3(a), 4(a), 5(a), and 6(a) shows a cross-sectional structure in the direction of gate length, while each of FIGS. 2(b), 3(b), 4(b), 5(b), and 6(b) shows a plane structure.

Figure 2B:
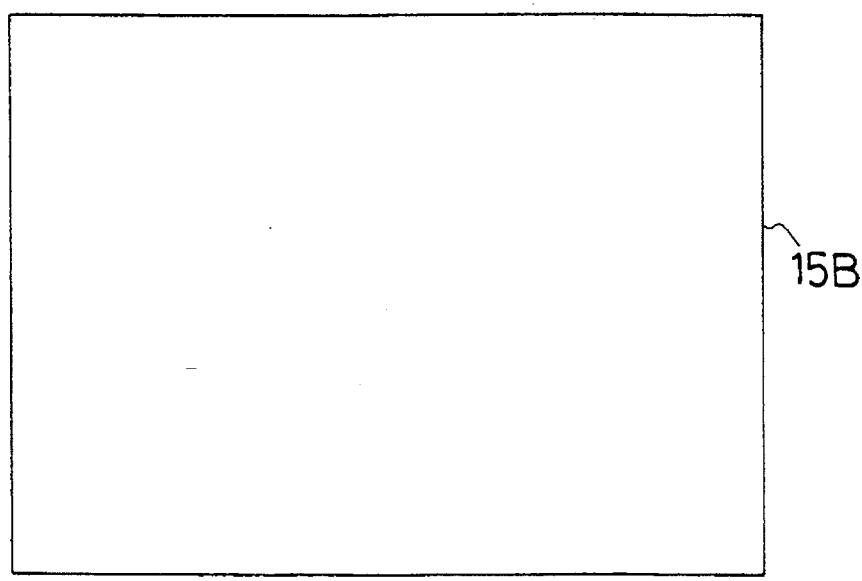

Initially, as shown in FIGS. 2(a) and 2(b), the conductive layer 12, undoped layer 13, and a contact layer 14B serving as the contact regions 14A are sequentially deposited by crystal growth on the semi-insulating substrate 11 in this order, followed by the deposition of a metal layer 15B with a high melting point serving as the ohmic electrodes 15A over the entire surface.

Figure 3A:
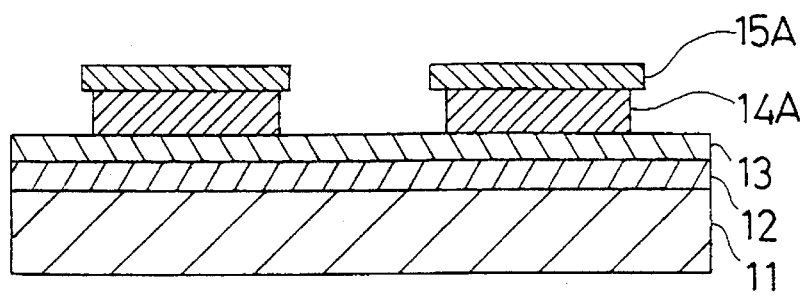
Figure 3B:
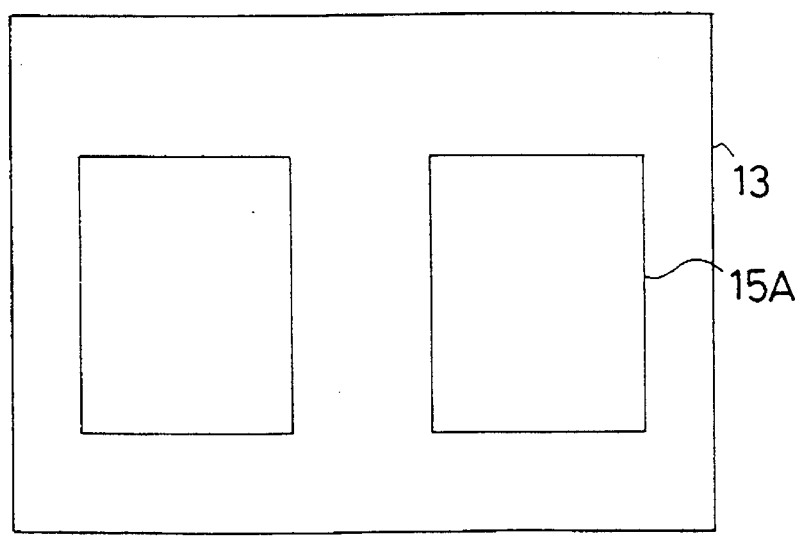

Next, as shown in FIGS. 3(a) and 3(b), the metal layer 15B with a high melting point is patterned into at least two squares by dry etching using, as a mask, a resist pattern (not shown) formed on the metal layer 15B with a high melting point, thereby forming the ohmic electrodes 15A. Thereafter, that portion of the contact layer 14B positioned exterior to the ohmic electrodes 15A is removed by anisotropic wet etching using the ohmic electrodes 15A as a mask, thereby forming the contact region 14A. Since anisotropic wet etching is performed in this step, an undercut portion is produced along the circumferential edges of the contact region 14A beneath the ohmic electrode 15A. If a GaAs substrate with a surface on a (100) plane orientation is used as the semi-insulating substrate 11 and if the direction of gate width is set to a [001] orientation, for example, a cross-sectional configuration with vertical undercut portions is obtained, as shown in FIG. 3(a). The configuration of the undercut portion formed along the circumferential edges of the contact region 14A is not limited. It may be vertical, outwardly tapered, or inwardly tapered in cross section.

Figure 4A:
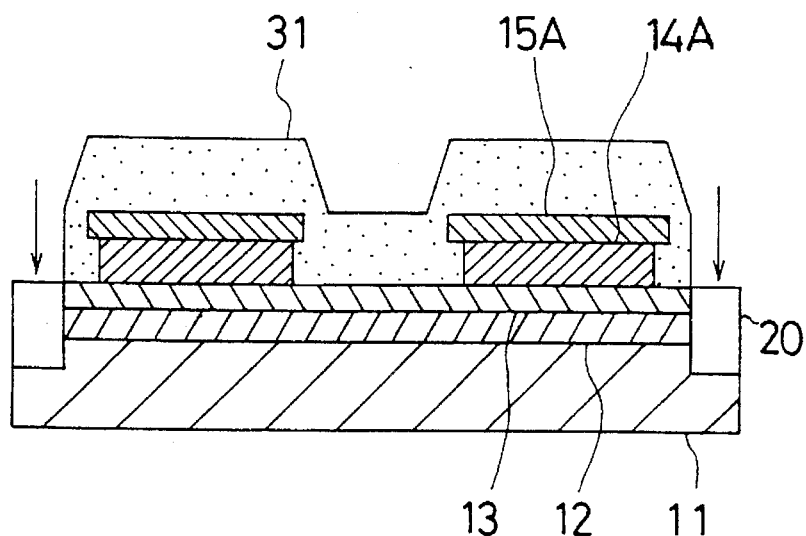
Figure 4B:
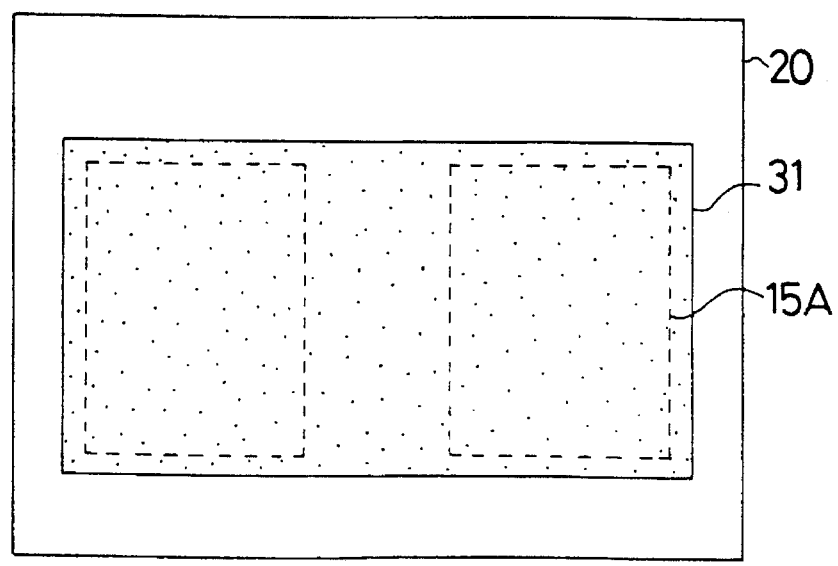

Then, after forming a first resist pattern 31 so as to cover the square ohmic electrodes 15A and their peripheral portion, as shown in FIGS. 4(a) and 4(b), hydrogen ions are implanted using the first resist pattern 31 as a mask, thereby forming the isolation region 20 composed of an insulating layer outside the ohmic electrodes 15A. Instead of hydrogen ion implantation as described above, wet etching may be performed so as to remove these portions of the conductive layer 12 and of the undoped layer 13 positioned exterior to the ohmic electrodes 15A.

Figure 5A:
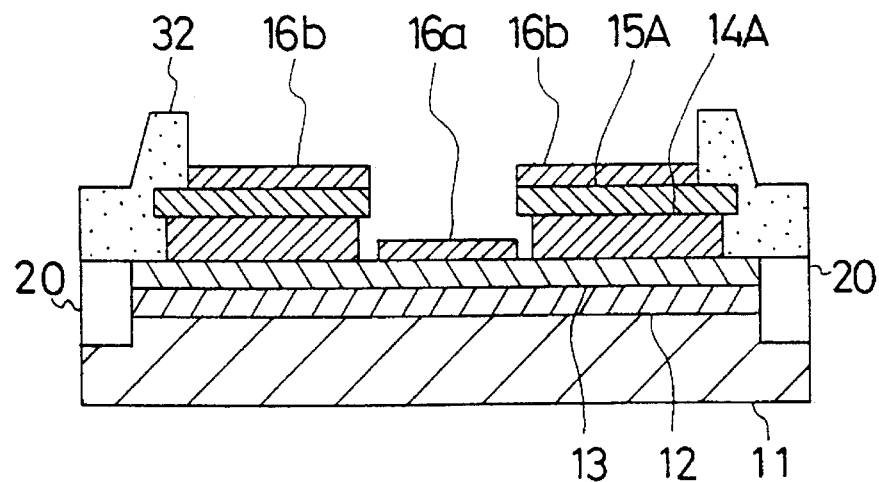
Figure 5B:
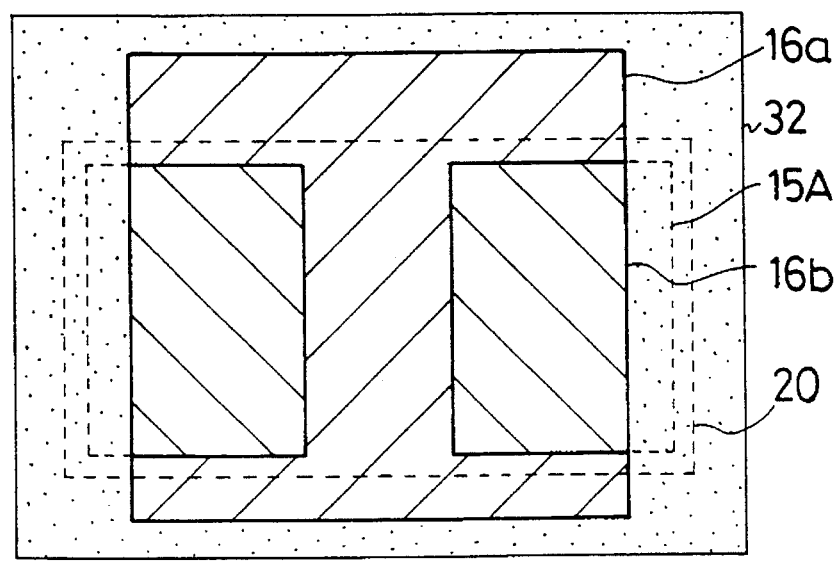

Next, as shown in FIGS. 5(a) and 5(b), the first resist pattern 31 is removed, followed by the formation of a second resist pattern 32 having openings corresponding to a first region between the ohmic electrodes 15A, to a second region extending continuously from the first region in the direction of gate width, and to a third region consisting of those portions of the ohmic electrodes 15A positioned closer to the gate electrode. Thereafter, the gate electrode 16a and the upper electrodes 16b are simultaneously formed by vapor deposition using the second resist pattern 32 as a mask. In this case, since the undercut portions are formed along the circumferential edges of the contact regions 14A, no electrical contact is provided between the gate electrode 16a and the upper electrodes 16b. On the other hand, the gate electrode 16a has extended in the direction of gate width so as to partially cover the isolation region 20. The extended portion functions as a withdrawn portion of the gate electrode 16a.

Figure 6A:
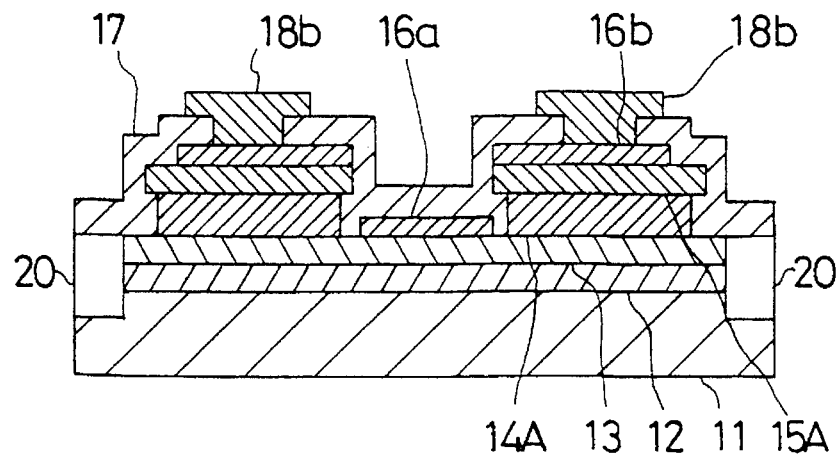
Figure 6B:
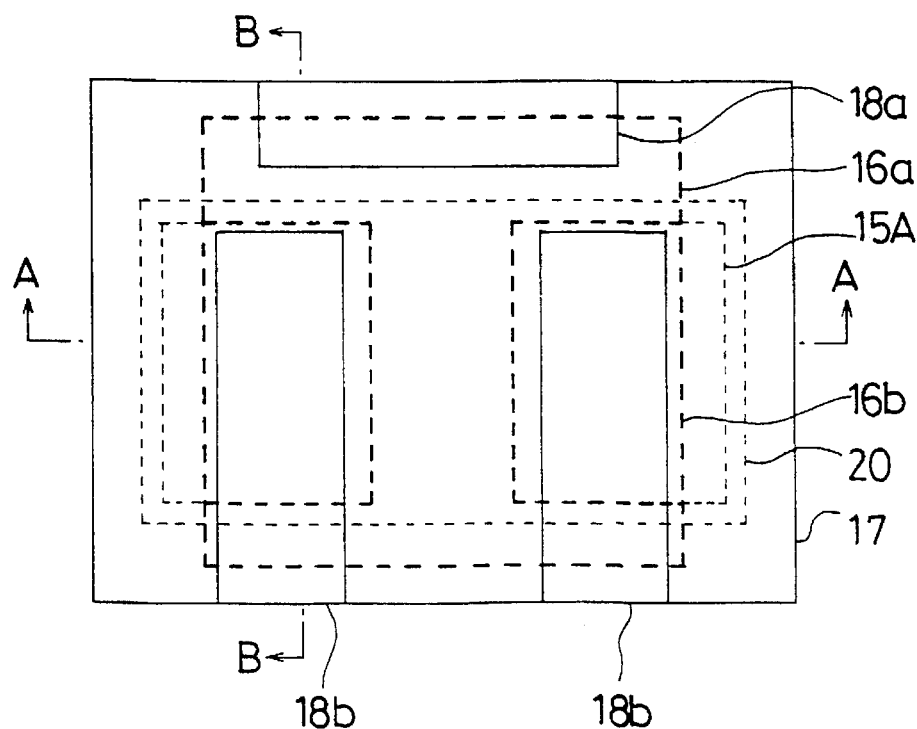

Next, as shown in FIGS. 6(a) and 6(b), the second resist pattern 32 is removed, followed by the deposition of the interlayer insulating film 17 over the entire surface. Thereafter, openings for contact with the gate electrode 16a and with the upper electrodes 16b are formed in the interlayer insulating film 17, followed by the simultaneous formation of the first wiring layer 18a and of the second wiring layers 18b by vapor deposition using the interlayer insulating film 17 with the openings as a mask, thereby completing the GaAs MISFET according to the first embodiment.

According to the first manufacturing method of a field-effect transistor described above, a field-effect transistor with the above structure can be formed in at least five steps of photolithography, resulting in a significant reduction in the number of process steps.

Figure 7A:
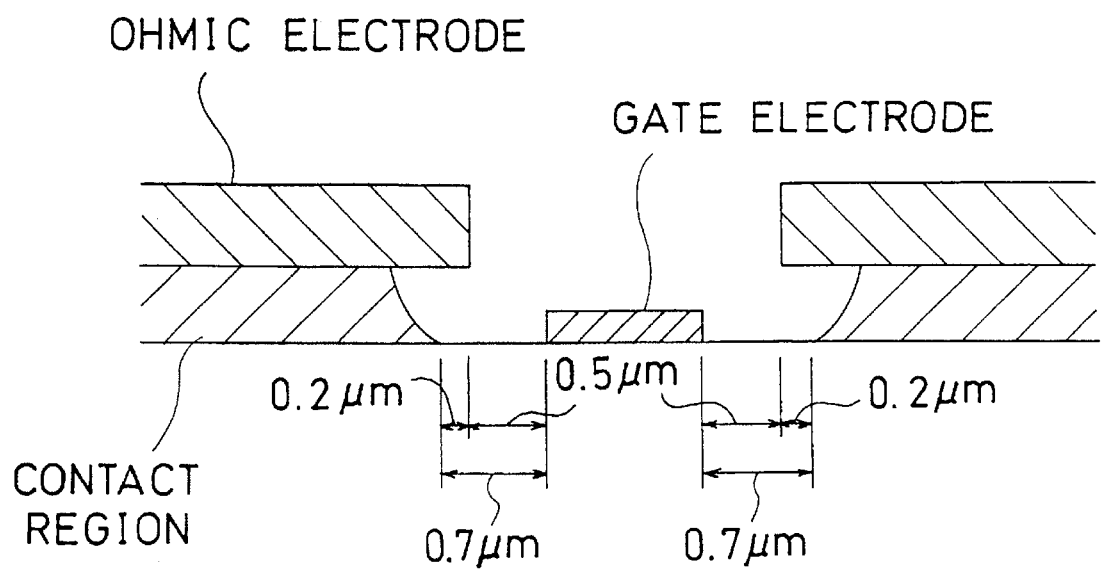
FIG. 7(a) is a cross section in the vicinity of a gate electrode of a field-effect transistor obtained in accordance with a manufacturing method using a resist pattern.
Figure 7B:
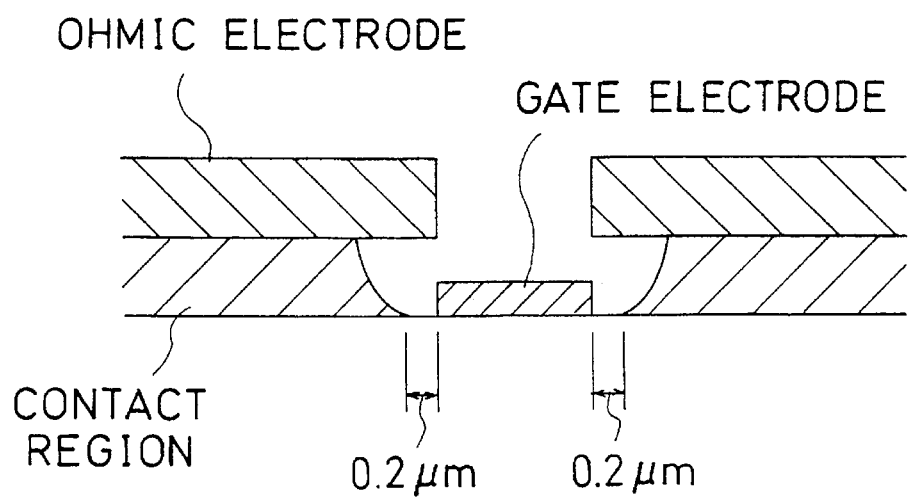
FIG. 7(b) is a cross section in the vicinity of a gate electrode of the field-effect transistor obtained in accordance with the first manufacturing method of the field-effect transistor according to the first embodiment.

FIG. 7(a) shows a cross-sectional structure in the vicinity of a gate electrode of a field-effect transistor obtained in accordance with a manufacturing method using a resist pattern. FIG. 7(b) shows a cross-sectional structure in the vicinity of the gate electrode of the field-effect transistor obtained in accordance with the first manufacturing method of the present invention. In the manufacturing method using a resist pattern, the distance between the ohmic electrode and the gate electrode is 0.5 μm, as shown in FIG. 7(a), since the accuracy of mask alignment is 0.5 μm. In the first manufacturing method according to the present invention, however, the distance between the ohmic electrode and the gate electrode is substantially 0 μm, since the gate electrode is formed by self alignment.

Figure 8:
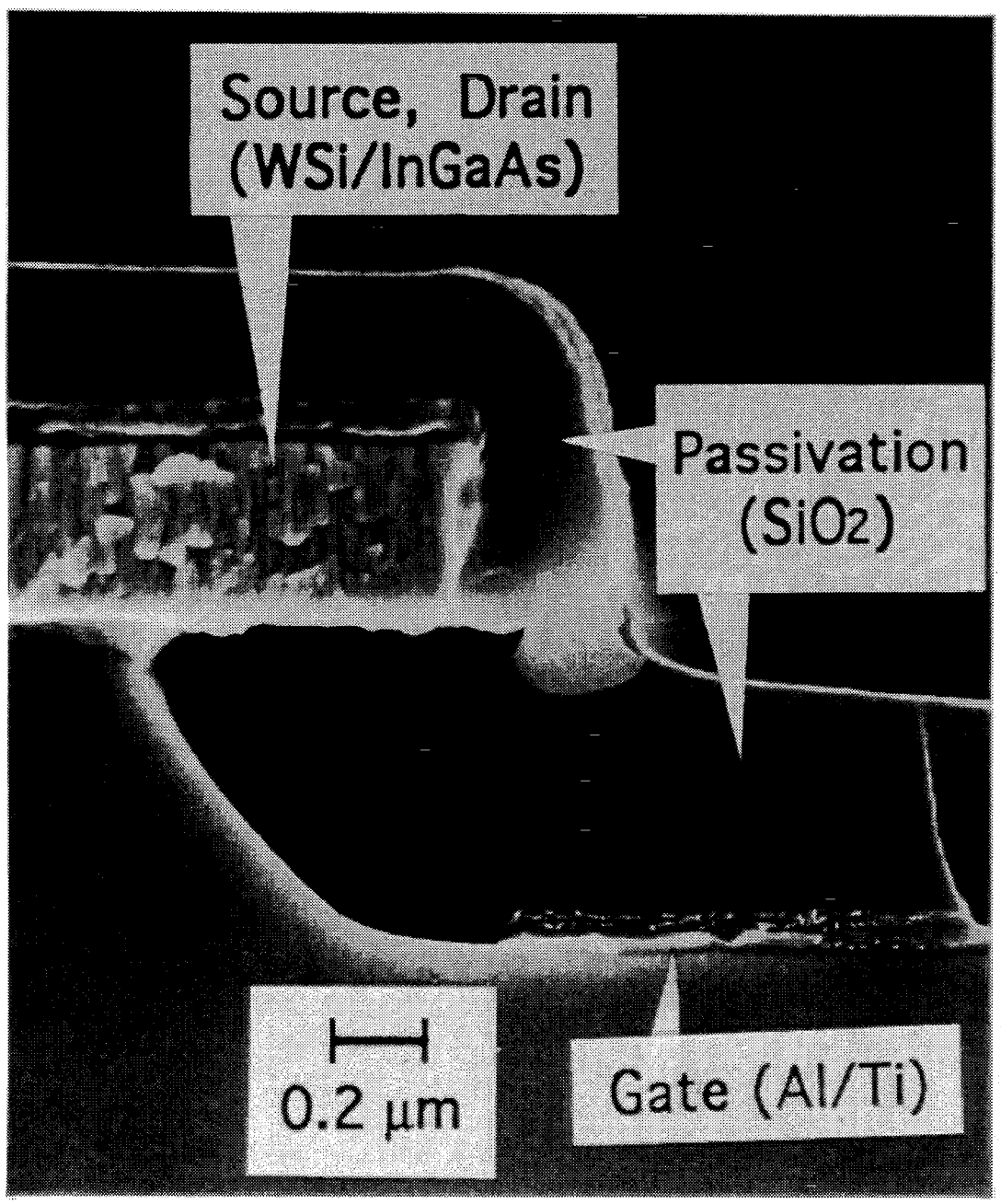
FIG. 8 is an SEM (scanning electron microscopy) micrograph of a GaAs MISFET obtained in accordance with the first manufacturing method of the field-effect transistor according to the first embodiment.

FIG. 8 is an SEM (scanning electron microscopy) micrograph of a GaAs MISFET obtained in accordance with the first manufacturing method according to the present invention. As is apparent from the drawing, the distance between the ohmic electrode (source electrode) and the gate electrode is substantially 0 μm.

Figure 9:
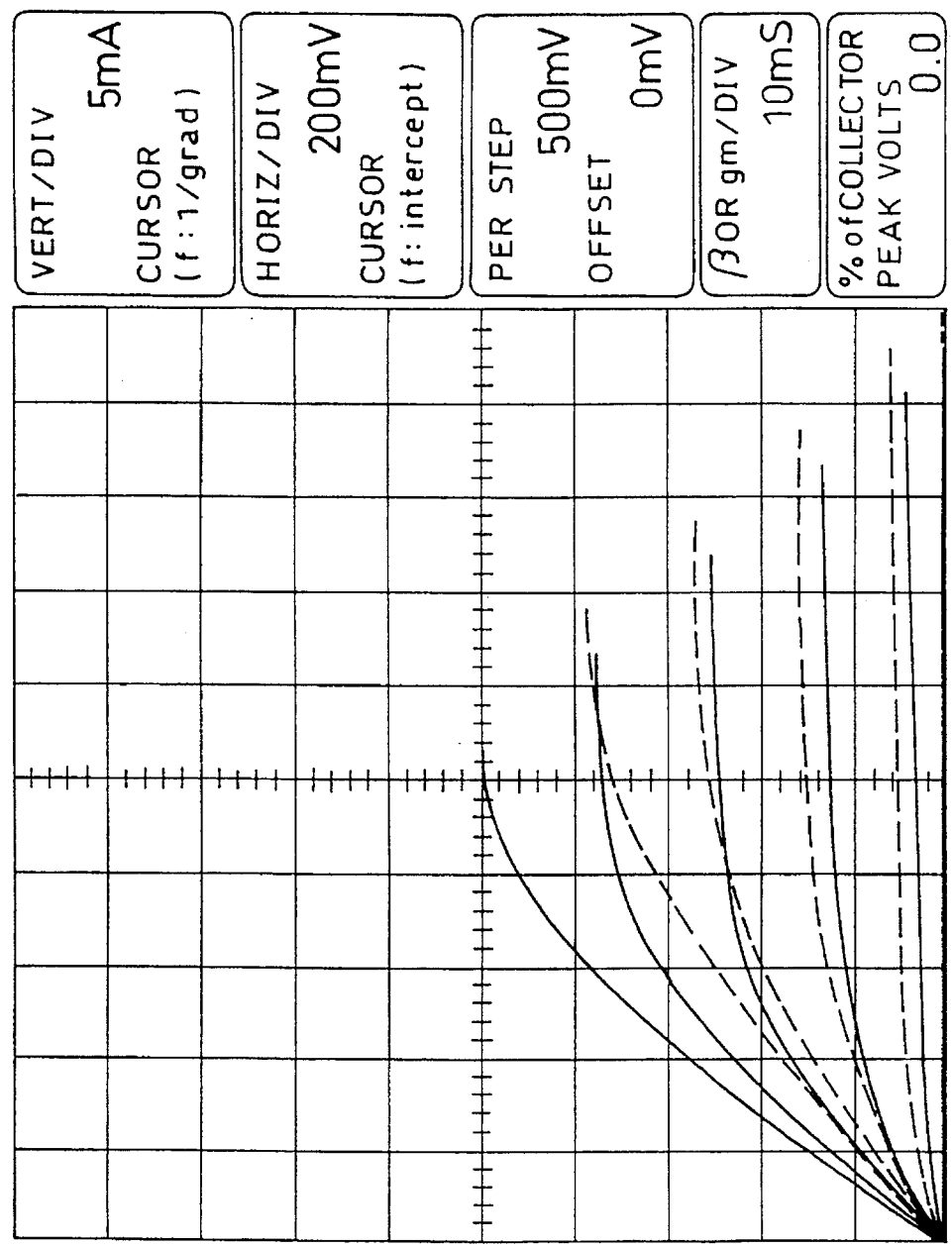
FIG. 9 is a view showing static characteristics of GaAs transistors obtained in accordance with the first manufacturing method of the field-effect transistor according to the first embodiment and in accordance with the manufacturing method using a resist pattern.
Figure 10A:
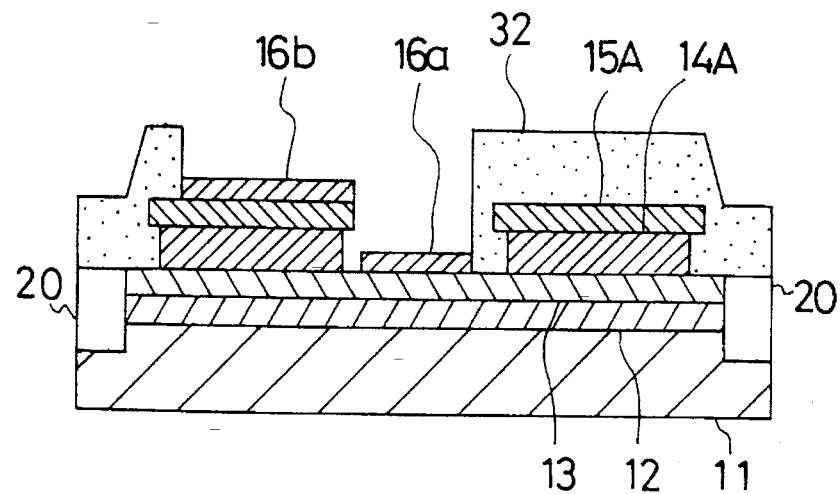
Figure 10B:
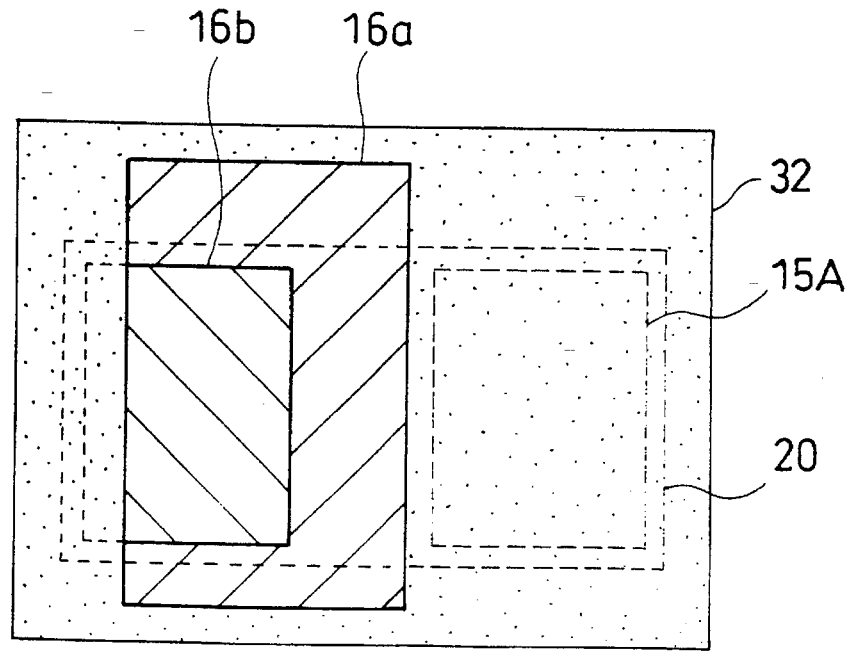

FIG. 9 shows static characteristics of GaAs MISFETs obtained in accordance with the first manufacturing method according to the present invention and in accordance with the first manufacturing method using a resist pattern. In the drawing, the solid lines represent the static characteristic of the GaAs MISFET obtained in accordance with the manufacturing method according to the present invention; the broken lines represent the static characteristic of the GaAs MISFET obtained in accordance with the manufacturing method using a resist pattern; the horizontal axis represents a drain voltage Vds; and the vertical axis represents a drain current Ids. One scale mark on the horizontal axis corresponds to 5 mA, while one scale mark on the vertical axis corresponds to 200 mV. As is apparent from the drawing, the ON resistance of the GaAs MISFET obtained in accordance with the manufacturing method according to the present invention has been remarkably reduced, compared with the ON resistance of the GaAs MISFET obtained in accordance with the manufacturing method using a resist pattern. In addition, the resistance decrease on source side attains about 20% increase of a maximum saturation current value.

Although the gate electrode 16a has been formed by self alignment in the region interposed between the ohmic electrodes 15A serving as the source and drain electrodes by using the ohmic electrodes 15A as a mask, it is also possible to form the gate electrode 16a by self alignment in the region interposed between the ohmic electrodes 15A serving as the source and drain electrodes by using, as a mask, only that one of the ohmic electrodes 15A serving as the source electrode. With the arrangement, the gate electrode 16a can be formed in a position extremely close only to the source electrode in two dimensions. Thereby, the maximum saturation current value is increased, though the effect of ON resistance is slightly restrained.

Below, a description will be given to a second manufacturing method of the field-effect transistor according to the first embodiment. The second manufacturing method is for manufacturing a field-effect transistor in which the gate electrode 16a is formed by self alignment using, as a mask, only that one of the ohmic electrodes 15A serving as the source electrode. Since the steps shown in FIGS. 2 to 4 are the same as those of the first manufacturing method described above, the description thereof will be omitted.

Figure 11:
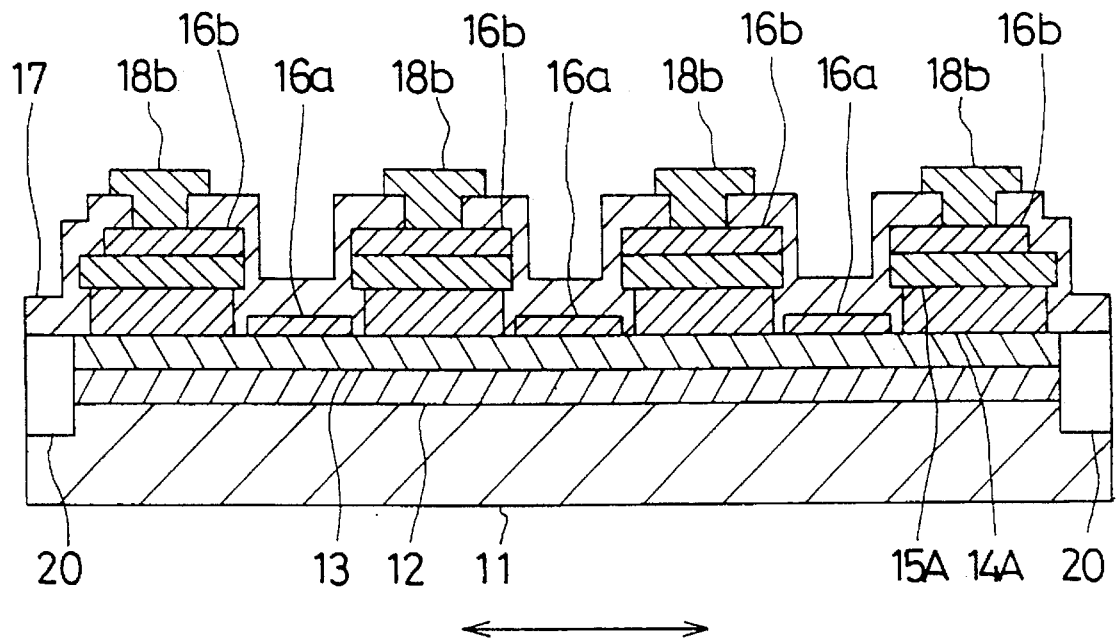
FIG. 11 is a cross section in the direction of gate length of a field-effect transistor according to a second embodiment of the present invention.
Figure 12:
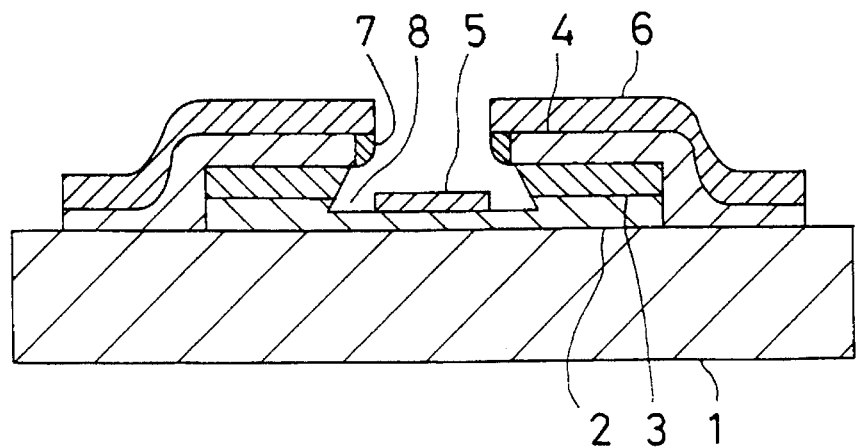
FIG. 12 is a cross section in the direction of gate length of a conventional field-effect transistor.

As shown in FIG. 4, the isolation region 20 is formed in an outside portion of the ohmic electrodes 15A, followed by the removal of the first resist pattern 31. Subsequently, as shown in FIG. 11, the second resist pattern 32 having openings corresponding to the first region between the ohmic electrodes 15A, to the second region extending continuously from the first region in the direction of gate width, and to a third region composed only of that portion of the ohmic electrode 15A serving as the source electrode which is positioned closer to the gate electrode. Thereafter, the gate electrode 16a and an upper electrode 16b for the source electrode are simultaneously formed by vapor deposition using the second resist pattern 32 as a mask. In this case, since the undercut portions are formed along the circumferential edges of the contact regions 14A, no electrical contact is provided between the gate electrode 16a and the upper electrodes 16b.

Next, after removing the second resist pattern 32, an upper electrode for the drain electrode is formed on the ohmic electrode 15A serving as the drain electrode in accordance with a conventional method, followed by the deposition of the interlayer insulating film 17 over the entire surface. Since the subsequent steps are the same as those of the first manufacturing method described above, the description thereof will be omitted.

Below, a description will be given to a comb-type power FET according to a second embodiment of the present invention, in which source regions and drain regions are alternately disposed.

FIG. 11 shows a cross-sectional structure in the direction of gate length of the power FET according to the second embodiment. On the semi-insulating substrate 11 are sequentially formed the conductive layer 12 and the undoped layer 13. On the undoped layer 13 are formed the four square contact regions 14 in juxtaposition. On the respective contact regions 14A are formed the ohmic electrodes 15A. Between the ohmic electrodes 15A above the undoped layer 14 are formed the respective gate electrodes 16a by self alignment. In FIG. 11 are shown: the upper electrodes 16b formed simultaneously with the formation of the gate electrodes 16a; the interlayer insulating films 17; and the first wiring layers 18b electrically connected to the upper electrodes 16b. The drawing of the second wiring layers electrically connected to the gate electrodes 16a is omitted in FIG. 11.

According to the second embodiment shown in FIG. 11, not only the power FET is formed easily, but also the ohmic electrodes 15A and the gate electrodes 16b are alternately disposed and no gap is observed in two dimensions therebetween, so that the area occupied by the FET is significantly reduced.

As described above, according to the second embodiment, the gate electrodes 16a and their respective withdrawn portions are formed by self alignment using, as a mask, the ohmic electrodes 15A each serving as the drain electrode or source electrode. Accordingly, no spacing for mask alignment exists betwe en an end of the gate electrode and the corresponding end of the source or drain electrode, so that the distance between the source electrode and the drain electrode is reduced, thereby significantly reducing the ON resistance.

We claim:

1. A field-effect transistor comprising:

a semi-insulating substrate;

a conductive layer formed on a specified region of said semi-insulating substrate;

a pair of square contact regions formed on said conductive layer so as to be opposed to each other and having their circumferential edges undercut;

a source electrode formed on one of said pair of contact regions so as to be in ohmic contact with said one contact region;

a drain electrode formed on the other of said pair of contact regions so as to be in ohmic contact with said other contact region;

a gate electrode formed, over said conductive layer in a first region between said source electrode and said drain electrode and in a second region extending continuously from said first region in a direction of gate width to the outside of said conductive layer, by self alignment using said source electrode as a mask, said gate electrode being smaller in layer thickness than said contact regions and in Schottky contact with said conductive layer; and an upper electrode for the source electrode formed on said source region in the same process in which said gate electrode is formed so as to be in ohmic contact with said source electrode.

2. A field-effect transistor according to claim 1, wherein said gate electrode is formed by self alignment using said source electrode and said drain electrode as a mask, said field-effect transistor further comprising an upper electrode for the drain electrode formed on said drain electrode so as to be in ohmic contact with said drain electrode.

3. A field-effect transistor according to claim 1, wherein an undoped layer is provided between said conductive layer and said pair of contact regions.

4. A field-effect transistor according to claim 1, wherein said semi-insulating substrate is composed of a GaAs substrate with a surface on a (100) plane orientation;

each of said conductive layer and contact layers is formed by crystal growth; and said direction of gate width is set to a [001] orientation.

5. A field-effect transistor according to claim 1, wherein each of said pair of contact regions is composed of InGaAs or InAs and each of said source electrode and drain electrode is composed of a metal with a high melting point.

* * * * *